United States Patent
Kishimoto et al.

(10) Patent No.: US 10,562,712 B2
(45) Date of Patent: Feb. 18, 2020

(54) TRAY SUPPLIER AND TRAY SUPPLY METHOD

(71) Applicant: Panasonic Intellectual Property Management Co., Ltd., Osaka (JP)

(72) Inventors: Masaki Kishimoto, Yamanashi (JP); Akira Kameda, Yamanashi (JP); Nobuyuki Kakita, Yamanashi (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 0 days.

(21) Appl. No.: 15/334,389

(22) Filed: Oct. 26, 2016

(65) Prior Publication Data

US 2017/0113878 A1    Apr. 27, 2017

(30) Foreign Application Priority Data

Oct. 27, 2015    (JP) .................................. 2015-210906

(51) Int. Cl.
*B65G 25/06*    (2006.01)
*H01L 21/677*    (2006.01)
(Continued)

(52) U.S. Cl.
CPC .......... *B65G 25/06* (2013.01); *B65G 57/035* (2013.01); *B65G 57/04* (2013.01); *B65G 59/045* (2013.01);
(Continued)

(58) Field of Classification Search
CPC ...... B65G 25/06; B65G 57/035; B65G 57/04; B65G 59/045; B65G 60/00; B65G 2201/0258; H01L 21/67721
(Continued)

(56) References Cited

U.S. PATENT DOCUMENTS 4,541,762 A * 9/1985 Tischler .................... B23Q 7/04
                                                        414/416.07
4,588,341 A * 5/1986 Motoda .................. B65G 47/06
                                                        414/331.14
(Continued)

FOREIGN PATENT DOCUMENTS

| | | |
|---|---|---|
| CN | 104010481 A | 8/2014 |
| JP | H07-061556 A | 3/1995 |
| JP | 2007-103979 A | 4/2007 |

OTHER PUBLICATIONS

English Translation of Chinese Search Report dated Sep. 20, 2019 for the related Chinese Patent Application No. 201610906952.9.

Primary Examiner — Lynn E Schwenning
(74) Attorney, Agent, or Firm — Pearne & Gordon LLP (57) ABSTRACT

A tray supplier which performs supplying and collecting of trays includes a supply-side tray storage unit, a collection-side tray storage unit, a first tray placer and a second tray placer on which the trays are placed, and a first placer mover and a second placer mover which respectively move the tray placers between the supply-side tray storage unit and the collection-side tray storage unit, in which a first movement shaft of the first placer mover and a second movement shaft of the second placer mover are disposed parallel to each other, lifting and lowering units which lift or lower the first tray placer and the second tray placer are provided, and interference between the placer movers does not occur.

5 Claims, 9 Drawing Sheets

(51) Int. Cl.
*B65G 57/03* (2006.01)
*B65G 57/04* (2006.01)
*B65G 59/04* (2006.01)
*B65G 60/00* (2006.01)

(52) U.S. Cl.
CPC ........ B65G 60/00 (2013.01); H01L 21/67721 (2013.01); *B65G 2201/0258* (2013.01)

(58) Field of Classification Search
USPC .......................................... 414/788.8, 790.4
See application file for complete search history.

(56) References Cited

U.S. PATENT DOCUMENTS

| | | | | |
|---|---|---|---|---|
| 4,720,228 A * | 1/1988 | Horiguchi | ............. | B65G 60/00 198/465.1 |
| 5,441,380 A * | 8/1995 | Horikawa | ............. | B65G 35/06 414/788.7 |
| 5,882,174 A * | 3/1999 | Woerner | ................ | B65G 60/00 414/788.7 |
| 6,518,745 B2 * | 2/2003 | Kim | ....................... | G01R 31/01 324/750.13 |
| 6,558,110 B2 * | 5/2003 | Lu | ..................... | H01L 21/68707 221/297 |
| 6,629,812 B1 * | 10/2003 | Lee | ....................... | B65G 65/00 414/331.11 |
| 6,941,647 B2 * | 9/2005 | Cho | ..................... | H05K 13/021 198/347.3 |
| 7,329,083 B2 * | 2/2008 | Nakazato | ............... | B65G 65/00 414/416.01 |
| 7,360,984 B1 * | 4/2008 | Sugiyama | ............... | B01L 9/543 414/798.1 |
| 7,463,493 B2 * | 12/2008 | Sim | .................... | H05K 13/0061 29/739 |
| 7,959,402 B2 * | 6/2011 | Hashinokuchi | ...... | B65G 57/302 221/221 |
| 2006/0040442 A1 * | 2/2006 | Fukae | ................... | G06T 7/0006 438/232 |
| 2008/0003084 A1 * | 1/2008 | Behnke | ............ | H01L 21/67706 414/331.18 |
| 2008/0182737 A1 * | 7/2008 | Jost | ....................... | B21D 43/18 483/14 |
| 2010/0104412 A1 * | 4/2010 | Abascal Albizu | ... | A22C 7/0053 414/795.2 |
| 2013/0266414 A1 * | 10/2013 | Anderson | ............. | B65G 57/04 414/793.2 |

\* cited by examiner

TRAY SUPPLIER AND TRAY SUPPLY METHOD

BACKGROUND

1. Technical Field

The present disclosure relates to a tray supplier and a tray supply method for supplying a tray, in which a plurality of components such as IC chips and FPCs are disposed to be lined up, to a component supply position.

2. Description of the Related Art

In an assembler which mounts components such as IC chips and FPCs onto a board to assemble a display panel, a tray supplier which picks up a component from a tray, in which a plurality of components are disposed to be lined up, using a work transfer mechanism and supplies the component to the assembler is used. In the tray supplier, a single tray is picked up from a supply-side tray storage unit and passed to a tray placer, and the tray is positioned at the component supply position by a tray placer. Subsequently, the components are sequentially picked up from the tray, which is positioned at the component supply position, by the work transfer mechanism, and when the components which are stored in the tray run out, the empty tray is moved by the tray placer, is passed to a collection-side tray storage unit, and the empty tray is collected. Subsequently, a new, different single tray is picked up again by the supply-side tray storage unit and passed to the tray placer.

The new other tray is positioned at the component supply position by the tray placer, and the supply of components to the work transfer mechanism is restarted.

As this type of tray supplier, there is known a device which is configured to simplify the work transfer mechanism for picking up the board, and to obtain a reduction in the size of the device and an increase in the speed of the transfer operation (for example, refer to PTL 1). In the related art described in the exemplary patent literature, by causing the trays to move in the Y direction between a first stacker and a second stacker, it is possible to ensure that the movement of a transfer head by the transfer head movement mechanism only occurs in the X direction. Accordingly, in comparison with the conventional art in which it is necessary to use an XY two-dimensional positioning mechanism, simplification and a reduction in size of the mechanism, and an increase in the speed of the transfer operation are realized.

CITATION LIST

Patent Literature

PTL 1: Japanese Patent Unexamined Publication No. 2007-103979

SUMMARY

In a tray supplier of the present disclosure which performs supplying and collecting of trays in which components to be mounted onto a board are stored, the tray supplier includes a supply-side tray storage unit which stores the trays, a collection-side tray storage unit which collects the trays from which the supplying of the components has been performed, a first tray placer and a second tray placer on which the trays are placed, and a first placer mover and a second placer mover which respectively move the first tray placer and the second tray placer between the supply-side tray storage unit and the collection-side tray storage unit, in which a movement shaft along which the first placer mover causes the first tray placer to move and a movement shaft along which the second placer mover causes the second tray placer to move are disposed parallel to each other.

A tray supply method of the present disclosure is a method of passing trays from a supply-side tray storage unit, which stores the trays in which components to be mounted onto a board are stored, to a first tray placer and a second tray placer, and moving the first tray placer or the second tray placer on which the tray from which component supplying has been performed is placed to cause a collection-side tray storage unit to collect the tray, in which when the supplying of the components is performed and one of the first tray placer and the second tray placer in which the trays are collected in a collection-side tray storage unit moves to the supply-side tray storage unit, the one of the first tray placer and the second tray placer is lifted or lowered and is moved in the direction of the supply-side tray storage unit so as not to interfere with the other of the first tray placer and second tray placer for which the supply of components is performed.

According to the present disclosure, it is possible to shorten the tray exchanging time to improve working efficiency.

BRIEF DESCRIPTION OF THE DRAWINGS

FIGS. 1A and 1B are configuration explanation diagrams of the entire configuration of a tray supplier of an embodiment of the present disclosure, where FIG. 1A is a top surface view and FIG. 1B is a side surface view;

FIGS. 2A to 2C are configuration explanation diagrams of a tray placer in the tray supplier of an embodiment of the present disclosure, where FIG. 2A is a sectional diagram taken along line II A-II A of FIG. 1A, FIG. 2B is a side surface view and a view in an arrow II B-II B direction, and FIG. 2C is a main part view of the tray placer;

FIGS. 3A and 3B are configuration explanation diagrams of a tray placement table of the tray supplier of an embodiment of the present disclosure, where FIG. 3A is a top surface view and FIG. 3B is a side surface view;

FIGS. 4A and 4B are configuration explanation diagrams of a tray which is used in the tray supplier of an embodiment of the present disclosure, where FIG. 4A is a top surface view and FIG. 4B is a sectional diagram of important parts;

FIGS. 5A to 5C are explanation diagrams of a tray installation state in the tray supplier of an embodiment of the present disclosure, where FIG. 5A is a side surface view, FIG. 5B is an enlarged diagram of important parts, and FIG. 5C is an enlarged diagram of other parts;

DETAILED DESCRIPTION

Before describing the embodiment of the present disclosure, a concise description will be given of the problems in the related art.

In the related art described above, although it is possible to increase the speed of the transfer operation, there is a problem in that time is required for an exchanging operation due to the exchanging system of the trays, and it is difficult to improve work efficiency. In other words, when one tray which stores the components becomes empty, it is necessary to stack the tray in the second stacker, and to subsequently pick up a new tray which is stacked in the first stacker and position the new tray at the component supply position. Therefore, every time the trays are exchanged, a waiting time occurs, and this becomes a cause of impedance to improvements in work efficiency.

In the present disclosure, there is provided a tray supplier capable of shortening the tray exchanging time to improve working efficiency.

Next, description will be given of an embodiment of the present disclosure with reference to the drawings. First, description will be given of the overall configuration of tray supplier 1, with reference to FIGS. 1A and 1B. Tray supplier 1 includes a function of performing the supplying and the collection of trays which store components such as FPCs which are to be mounted onto a board such as a liquid crystal panel.

Figure 1A:
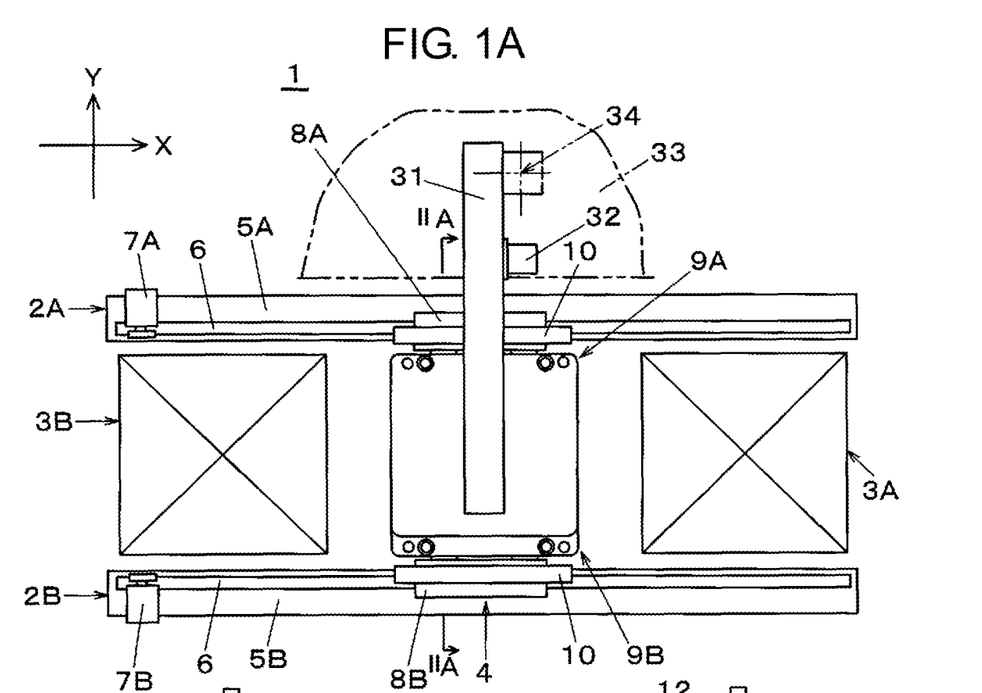

As illustrated in FIG. 1A, tray supplier 1 is provided with first movement shaft 2A and second movement shaft 2B, which are disposed in the X direction in plan view, and first movement shaft 2A and second movement shaft 2B are disposed parallel to each other separated by a predetermined interval in the Y direction, which is perpendicular to the X direction. First movement shaft 2A and second movement shaft 2B are held by structural members (not illustrated) which are arranged on a bottom surface side, and supply-side tray storage unit 3A and collection-side tray storage unit 3B are disposed in-line between first movement shaft 2A and second movement shaft 2B to interpose component pick-up stage 4.

Supply-side tray storage unit 3A includes a function of supplying trays 17, in which components 18 are stored in an orderly manner (refer to FIG. 4A), in a stacked state. Collection-side tray storage unit 3B includes a function of collecting trays 17, for which supplying of components 18 is performed and trays 17 are emptied, in a stacked state. Component pick-up stage 4 is provided in a position between supply-side tray storage unit 3A and collection-side tray storage unit 3B, and is provided with movement table 31, which extends in the Y direction, and transfer head 32 which is moved by movement table 31. Tray 17 which is picked up from supply-side tray storage unit 3A is transported to component pick-up stage 4 and becomes a component pick-up target. In other words, component 18 which is stored in tray 17 is picked up by transfer head 32, and is passed to component passing position 34 which is set in work facility 33 such as a panel assembler.

Figure 1B:
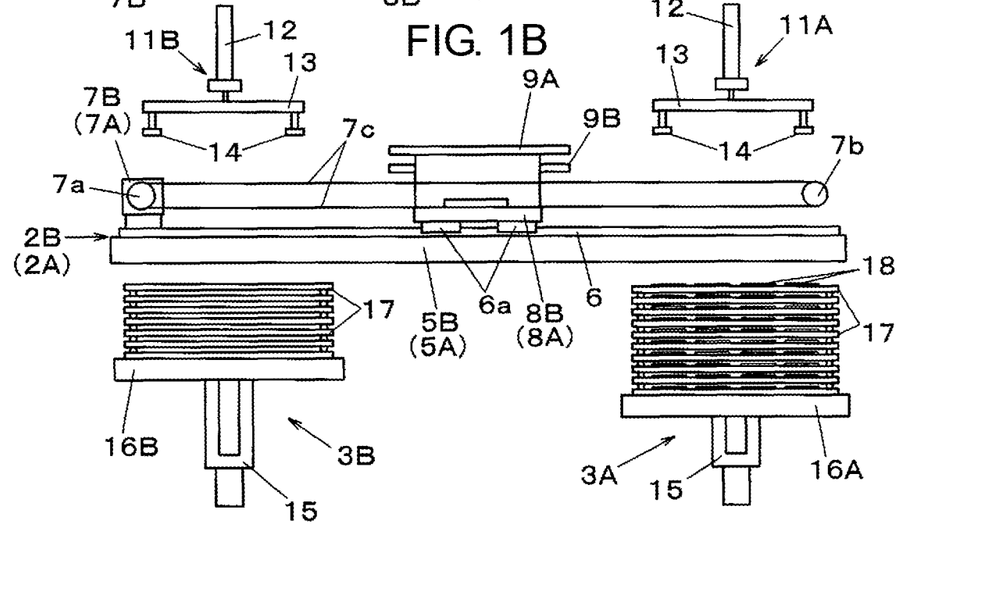

As illustrated in FIG. 1B, supply-side tray storage unit 3A and collection-side tray storage unit 3B are provided with supply-side tray stacker 16A and collection-side tray stacker 16B, which are both lifted and lowered by lifting and lowering mechanism 15. In supply-side tray storage unit 3A, trays 17 are stored in a stacked state, and in trays 17, components 18 are stored in an orderly manner (refer to FIG. 4A) on a top surface of supply-side tray stacker 16A. In collection-side tray storage unit 3B, trays 17 from which components 18 are picked up and trays 17 are emptied are stored in a stacked state on the top surface of collection-side tray stacker 16B.

Tray supply head 11A and tray collection head 11B are arranged above supply-side tray storage unit 3A and collection-side tray storage unit 3B, respectively. Each of tray supply head 11A and tray collection head 11B is configured to lift and lower suction holding unit 13, on which a plurality of suction tools 14 are installed, using lifting and lowering cylinder 12.

Tray supply head 11A includes a function of suction holding tray 17 which is stacked on supply-side tray stacker 16A of supply-side tray storage unit 3A, that is, tray 17 in a state in which components 18 are stored, using suction tool 14, to pick up tray 17, and placing tray 17 on first tray placer 9A or second tray placer 9B (described hereinafter). Tray collection head 11B includes a function of suction holding tray 17, from which components 18 are picked up at component pick-up stage 4 to render tray empty, to pick up tray 17 from first tray placer 9A or second tray placer 9B using suction tool 14, and stacking tray 17 on collection-side tray stacker 16B of collection-side tray storage unit 3B to collect tray 17.

Description will be given of the functions and configuration of first movement shaft 2A and second movement shaft 2B. Guide rails 6 are arranged along approximately the entire length of the top surfaces of each first base member 5A and second base member 5B which form first movement shaft 2A and second movement shaft 2B. Slider 6a which is fitted to each guide rail 6 to slide freely is fixed to first movement bracket 8A and second movement bracket 8B which are arranged to face each other (refer to FIG. 2A). First movement bracket 8A and second movement bracket 8B hold first tray placer 9A and second tray placer 9B, respectively, via a lifting and lowering unit described in FIGS. 2A to 2C in a state in which a single side is held and the tray placer extends in the inside direction. First tray placer 9A and second tray placer 9B are capable of being moved horizontally on an individual basis by first movement shaft 2A and second movement shaft 2B, respectively.

First motor 7A and second motor 7B are arranged on the one side end of first base member 5A and second base member 5B, respectively, and drive pulley 7a is installed on the rotating shaft of first motor 7A and second motor 7B. follower pulleys 7b are arranged on the other side ends of first base member 5A and second base member 5B, and belt 7c is attached to drive pulley 7a and follower pulley 7b. Belt 7c is joined to first movement bracket 8A and second movement bracket 8B on the top surfaces of first base member 5A and second base member 5B (also refer to FIG. 2A), and by rotationally driving first motor 7A and second motor 7B, belt 7c runs horizontally in the X direction on first base member 5A and second base member 5B. Accordingly, it is possible to cause first tray placer 9A and second tray placer 9B to move in the X direction above supply-side tray storage unit 3A, collection-side tray storage unit 3B, and component pick-up stage 4.

In this configuration, first movement bracket 8A moves through a drive mechanism which is formed of first motor 7A, drive pulley 7a, follower pulley 7b, and belt 7c, and a guide mechanism which is formed of guide rail 6 and slider 6a. First movement bracket 8A is a first placer mover which causes first tray placer 9A to move between supply-side tray storage unit 3A and collection-side tray storage unit 3B.

Similarly, second movement bracket 8B moves through a drive mechanism which is formed of second motor 7B, drive pulley 7a, follower pulley 7b, and belt 7c, and a guide mechanism which is formed of guide rail 6 and slider 6a. Second movement bracket 8B is a second placer mover which causes second tray placer 9B to move between supply-side tray storage unit 3A and collection-side tray storage unit 3B. First movement shaft 2A along which first placer mover causes first tray placer 9A to move and second movement shaft 2B along which second placer mover causes second tray placer 9B to move are disposed parallel to each other.

In a state in which tray 17, in which components 18 are stored, is picked up by tray supply head 11A, first tray placer 9A or second tray placer 9B is moved to supply-side tray storage unit 3A, and by lowering suction holding unit 13 of tray supply head 11A in this state, it is possible to place tray 17 in a state in which components 18 are stored therein on first tray placer 9A or second tray placer 9B. In a state in which first tray placer 9A or second tray placer 9B on which tray 17 is placed is positioned at component pick-up stage 4, the end of tray 17 is retained from the top surface side by retaining member 10 (refer to FIGS. 2A and 5C), and tray 17 is prevented from lifting up.

First tray placer 9A or second tray placer 9B in a state in which empty tray 17 is placed thereon is moved to collection-side tray storage unit 3B, and by lowering suction holding unit 13 of tray collection head 11B in this state, it is possible to pick up empty tray 17 from first tray placer 9A or second tray placer 9B and suction hold tray 17 using tray collection head 11B. By lowering suction holding unit 13 of tray collection head 11B in a state in which first tray placer 9A or second tray placer 9B is withdrawn from collection-side tray storage unit 3B, the empty tray 17 is stacked on collection-side tray stacker 16B and is collected.

Figure 2A:
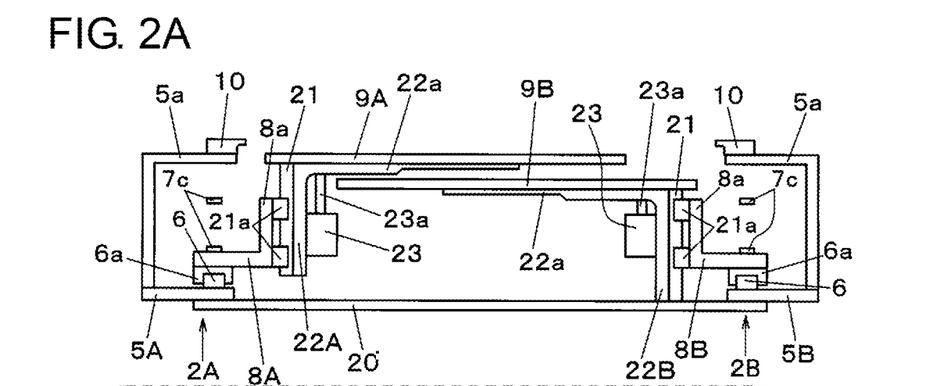

FIG. 2A illustrates a cross section taken along line II A-II A in FIG. 1A. First base member 5A is joined to second base member 5B by joining member 20, and inverted L-shaped cover members 5a which extend upward are provided on the outside ends of first base member 5A and second base member 5B. Retaining member 10 (illustrated in FIG. 1A) is installed on the inside end of each cover member 5a. In FIG. 1A, depiction of cover member 5a is omitted.

First movement bracket 8A and second movement bracket 8B which are fixed to slider 6a on first movement shaft 2A and second movement shaft 2B are L-shaped members which include vertical plates 8a which stand upright. Each vertical plate 8a is joined to one of first lifting and lowering bracket 22A or second lifting and lowering bracket 22B via a vertical direction guide mechanism formed of guide rail 21 and slider 21a. First lifting and lowering bracket 22A and second lifting and lowering bracket 22B are both inverted L-shaped members which include joined plate 22a which extends from the top end in an inside horizontal direction, and first tray placer 9A and second tray placer 9B are fixed, in a state of facing each other, to the top surface of joined plate 22a of first lifting and lowering bracket 22A and second lifting and lowering bracket 22B, respectively. Cylinder 23 is joined to vertical plate 8a with rod 23a in an upward-facing orientation, and by driving cylinder 23 to cause rod 23a to extend or withdraw, it is possible to lift and lower first tray placer 9A and second tray placer 9B.

Figure 2B:
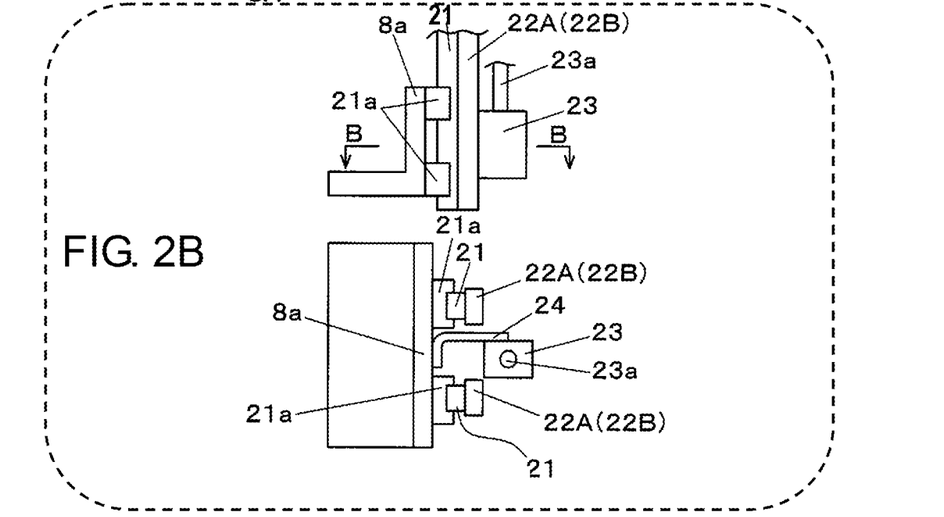

As illustrated in FIG. 2B, each guide rail 21 which is slidably fitted to slider 21a which is fixed to vertical plate 8a is joined to first lifting and lowering bracket 22A or second lifting and lowering bracket 22B. Here, as illustrated in the II B-II B arrow view, first lifting and lowering bracket 22A or second lifting and lowering bracket 22B is joined to vertical plate 8a via two guide mechanisms (slider 21a and guide rail 21) which are arranged at a predetermined interval, and first lifting and lowering bracket 22A or second lifting and lowering bracket 22B also assumes a divided-into-two shape corresponding to the positions of the guide mechanisms. Bracket 24 for holding cylinder 23 is joined between two sliders 21a which are arranged at a predetermined interval on vertical plate 8a. Bracket 24 extends to the inside between first lifting and lowering bracket 22A or second lifting and lowering bracket 22B which is divided into two, and holds cylinder 23.

In the configuration described above, as illustrated in FIG. 2C, by operating cylinder 23, it is possible to lift and lower first tray placer 9A or second tray placer 9B between the two positions of first height level L1 and second height level L2. In other words, by causing rod 23a to protrude, first lifting and lowering bracket 22A or second lifting and lowering bracket 22B is lifted, and first tray placer 9A or second tray placer 9B is positioned at first height level L1.

Figure 2C:
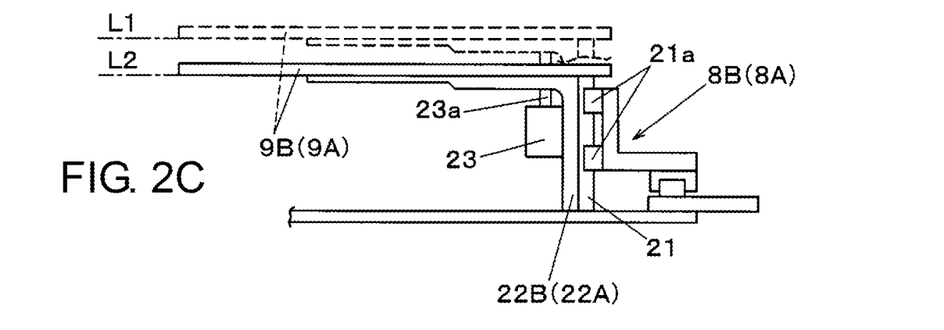

First height level L1 is a height level for performing passing of tray 17 between tray supply head 11A and tray collection head 11B in supply-side tray storage unit 3A and collection-side tray storage unit 3B, or for picking up tray 17 at component pick-up stage 4. By causing rod 23a to sink in, first lifting and lowering bracket 22A or second lifting and lowering bracket 22B is lowered, first tray placer 9A or second tray placer 9B is positioned lower than first height level L1 by a predetermined height, that is, is positioned at second height level L2 which is lower by a height dimension at which positional interference between the first placer mover (described earlier) and the second placer mover does not occur. In other words, due to cylinder 23 being provided on the first placer mover and the second placer mover (described earlier) and causing first tray placer 9A or second tray placer 9B to be lifted or lowered, a lifting unit which lifts and lowers tray 17 which is placed thereon is formed.

According to the configuration which is provided with such a lifting and lowering unit, after passing tray 17 to collection-side tray storage unit 3B, one of the first placer mover and the second placer mover is capable of lifting or lowering one of first tray placer 9A and second tray placer 9B so as not to interfere with the other of the first placer mover and the second placer mover, and the one tray placer is moved in the direction of supply-side tray storage unit 3A without causing interference between the two tray placers.

Figure 3A:
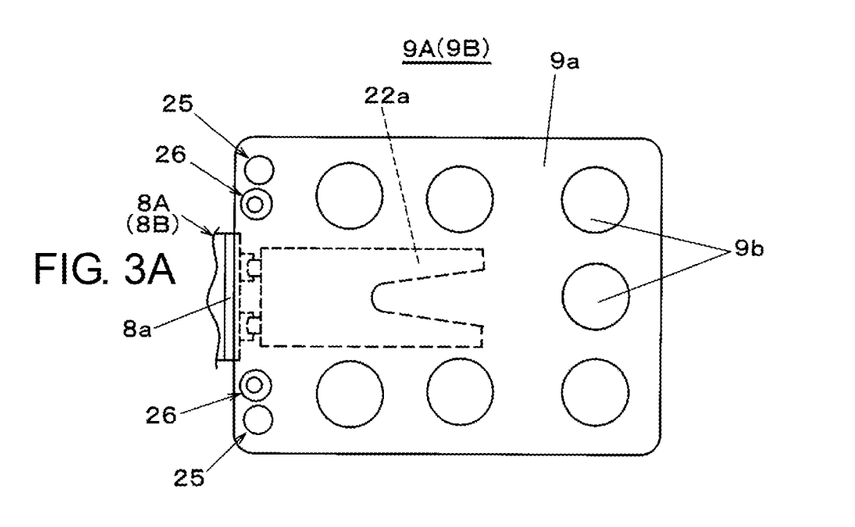
Figure 3B:
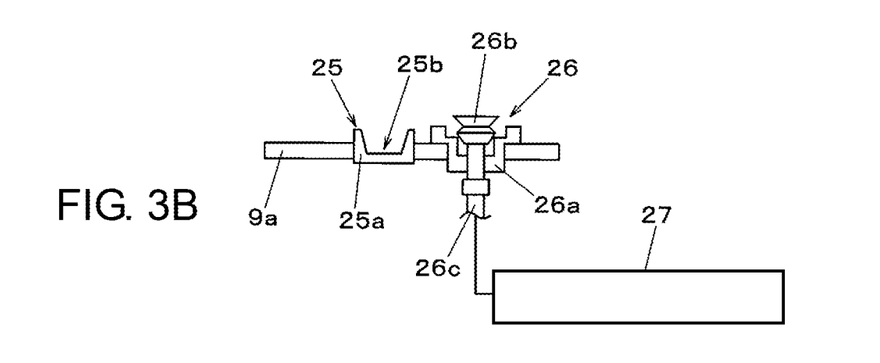
Figure 4A:
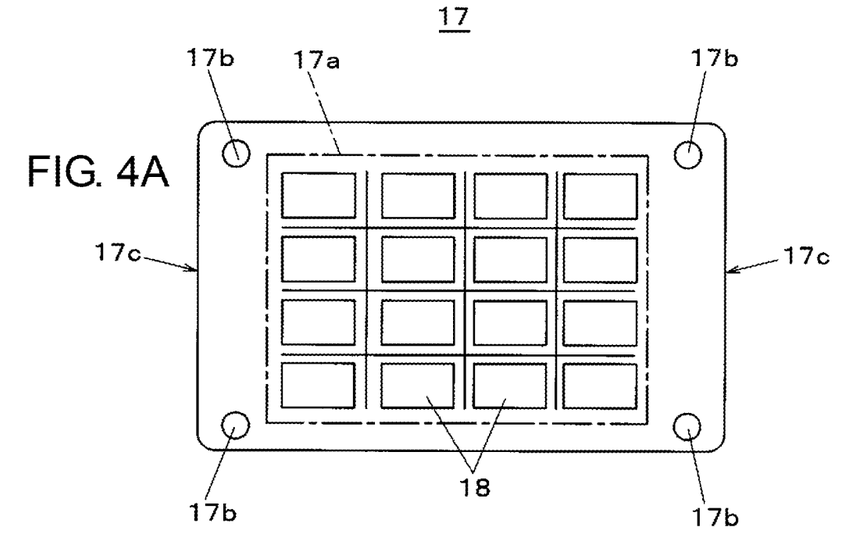
Figure 4B:
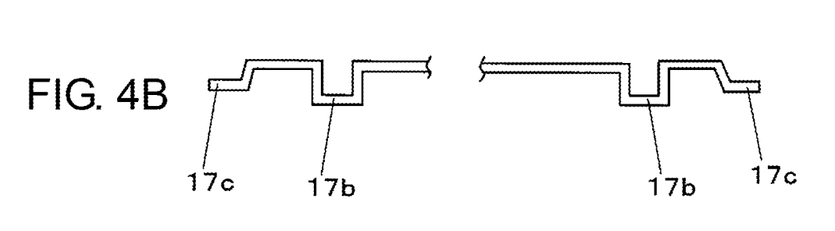

Next, description will be given of the configuration of first tray placer 9A, second tray placer 9B, and tray 17, with reference to FIGS. 3A to 4B. As illustrated in FIG. 3A, placement table 9a on which tray 17 (refer to FIGS. 4A and 4B) is placed is the main constituent element of each of first tray placer 9A and second tray placer 9B, and each of first tray placer 9A and second tray placer 9B is fixed to the top surface of joined plate 22a illustrated in FIG. 2A by screw fastening. As illustrated in FIG. 4A, components 18 such as FPCs are stored in an orderly, planar manner in a grid formation in component holding frames 17a which are set in tray 17. As illustrated in FIG. 4B, positioning protrusions 17b which extend to the bottom surface side are provided in the vicinity of each corner of tray 17, and overhanging edge portion 17c which overhangs to the outside is formed on the outer periphery of tray 17.

A plurality of openings 9b are provided in placement table 9a, and a pair of positioning portions 25 and a pair of suction holders 26 are provided on the edge of first movement bracket 8A or second movement bracket 8B side. As illustrated in FIG. 3B, positioning portion 25 is configured to have positioning member 25a, in which fitting hole 25b is formed, attached to placement table 9a. Suction holder 26 is configured to have suction unit 26a, which contains suction pad 26b which is oriented with the suction surface facing upward, attached to placement table 9a. Suction pad 26b is connected to vacuum suction source 27 via suction tube 26c.

Figure 5A:
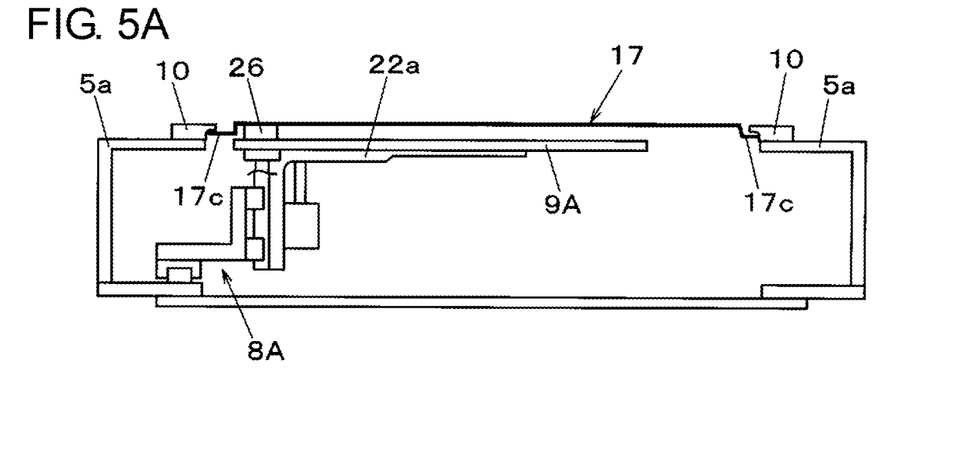
Figure 5B:
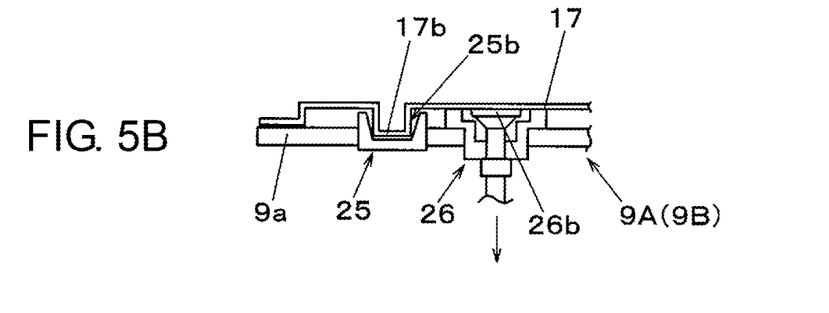
Figure 5C:
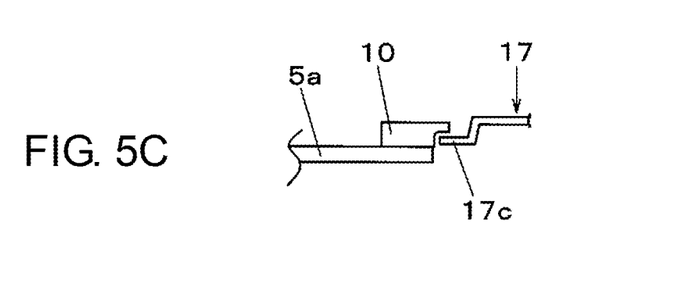

FIG. 5A illustrates a state in which tray 17 is placed on placement table 9a, and tray 17 is placed in a so-called overhanging state in which the leading end of one side of tray 17 partially overhangs from placement table 9a. At this time, as illustrated in FIG. 5B, the positioning of tray 17 on placement table 9a is performed by fitting positioning protrusions 17b (refer to FIGS. 4A and 4B) which are formed on tray 17 into fitting holes 25b. In suction holder 26, tray 17 is suction held by suction pads 26b due to vacuum suction being performed from vacuum suction source 27 (refer to FIG. 3B) in a state in which suction pads 26b are in contact with the bottom surface of tray 17. Accordingly, positional fixing of tray 17 on placement table 9a is performed. Overhanging edge portions 17c of both ends of tray 17 are retained from the top surface side by retaining member 10 which is disposed on first base member 5A, and a problem of tray 17 being sucked and lifting up during the pick-up operation of transfer head 32 is prevented.

Tray supplier 1 illustrated in the present embodiment is configured as described above, and hereinafter, description will be given of a tray supply method of tray supplier 1 with reference to FIGS. 6A to 9C. In the tray supply method, trays 17 are passed from supply-side tray storage unit 3A, which stores trays 17 which store components 18 to be mounted onto boards, to first tray placer 9A and second tray placer 9B. Then, first tray placer 9A and second tray placer 9B, on which trays 17 for which component supply to work facility 33 is performed are placed, are moved and trays 17 are collected in collection-side tray storage unit 3B.

Figure 6A:
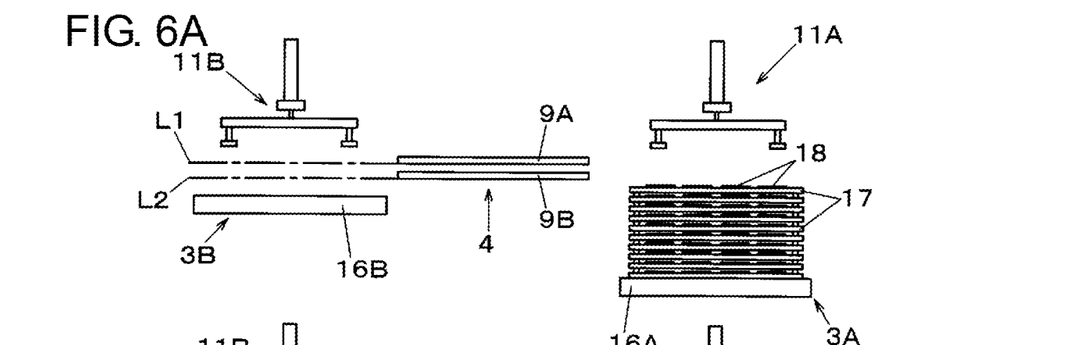
FIGS. 6A to 6D are operation explanation diagrams illustrating a tray supply method of the tray supplier of an embodiment of the present disclosure, and are diagrams illustrating the state of progression of operation, in order.

FIG. 6A illustrates the state at the start time of the tray supply operation. In other words, in this state, a plurality of trays 17 which store components 18 are stacked on supply-side tray stacker 16A in supply-side tray storage unit 3A, and no trays 17 are present on collection-side tray stacker 16B in collection-side tray storage unit 3B. In component pick-up stage 4, first tray placer 9A is positioned at first height level L1, and second tray placer 9B is positioned at second height level L2. Depending on the disposition of first tray placer 9A and second tray placer 9B before the start time of the tray supply operation, the positional relationship described above may be the reverse state.

Figures 6B, 6C, 6D:
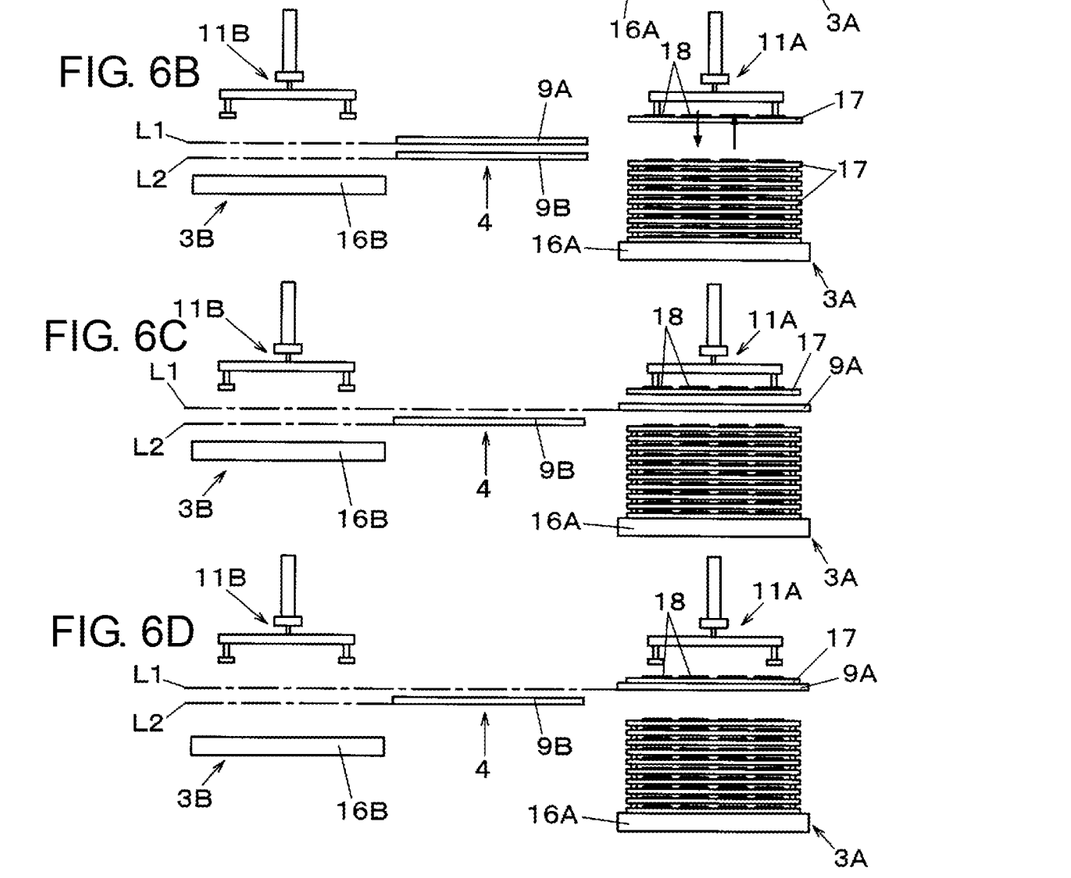

As illustrated in FIG. 6B, when the tray supply work is started, at supply-side tray storage unit 3A, tray 17 which stores components 18 is picked up by tray supply head 11A. Next, as illustrated in FIG. 6C, first tray placer 9A which is positioned at first height level L1 is moved from component pick-up stage 4 to above supply-side tray storage unit 3A, that is, to below tray 17 which is suction held by tray supply head 11A. As illustrated in FIG. 6D, by causing tray supply head 11A to perform a tray transfer operation, tray 17 which stores components 18 is placed on first tray placer 9A.

Figure 7A:
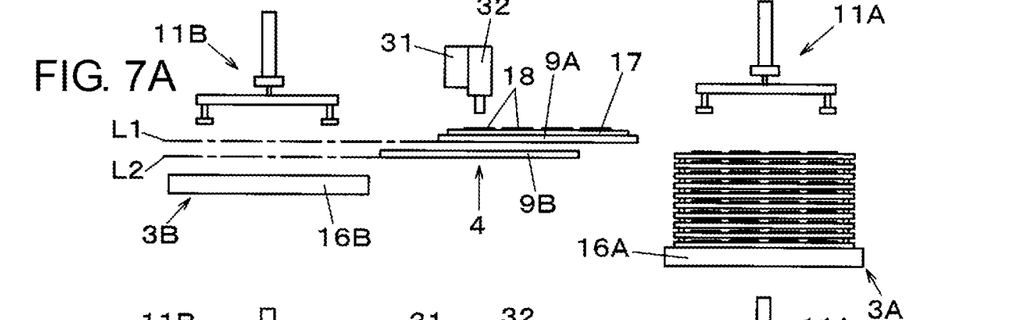
FIGS. 7A to 7D are operation explanation diagrams illustrating a tray supply method of the tray supplier of an embodiment of the present disclosure, and are diagrams illustrating the state of progression of operation, in order.
Figure 7B:
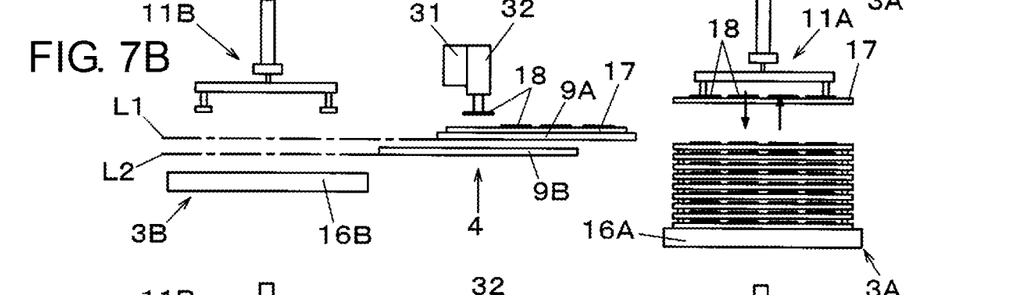

Next, as illustrated in FIG. 7A, a component supply operation is started in which first tray placer 9A on which trays 17 storing components 18 are placed is moved to component pick-up stage 4, component 18 is picked up from tray 17 by transfer head 32 which moves due to movement table 31, and component 18 is passed to component passing position 34 of work facility 33 (refer to FIG. 1A). Transfer head 32 moves in the Y direction in order to perform an operation of picking up the next component 18, and picks up components 18 which are disposed to be lined up in the Y direction in tray 17 in order. When a predetermined row of components 18 in the Y direction of tray 17 is depleted, first tray placer 9A moves from the predetermined row by one row to collection-side tray storage unit 3B side. Subsequently, transfer head 32 performs a component supply operation of picking up component 18 from tray 17 again, and passing component 18 to component passing position 34 of work facility 33. As illustrated in FIG. 7B, while the component supply operation is being executed, at supply-side tray storage unit 3A, a new tray 17 in which components 18 are stored is picked up by tray supply head 11A.

Figure 7C:
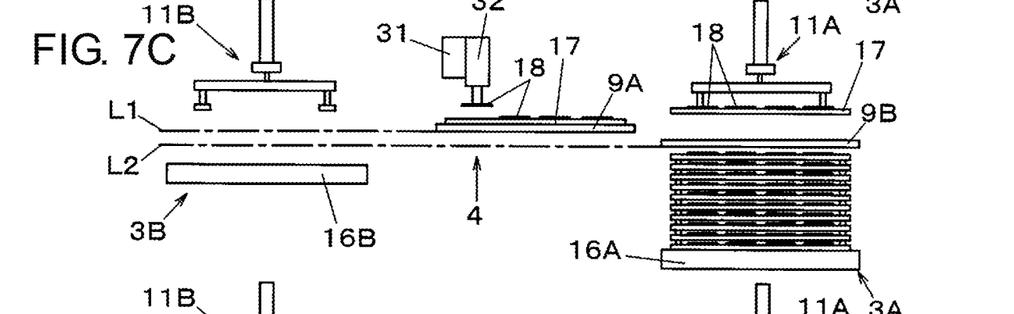
Figure 7D:
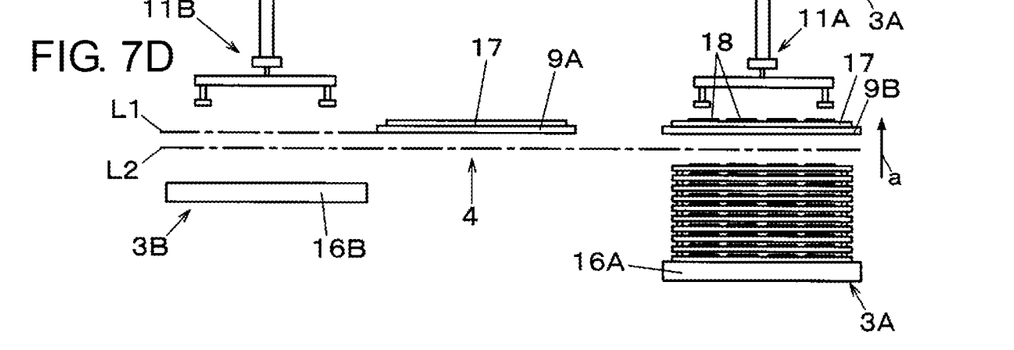

Next, as illustrated in FIG. 7C, second tray placer 9B which is positioned at second height level L2 is moved from component pick-up stage 4 to above supply-side tray storage unit 3A, that is, to below a new tray 17 which is suction held by tray supply head 11A. As illustrated in FIG. 7D, second tray placer 9B is lifted from second height level L2 to first height level L1 (arrow a), and next, a new tray 17 which stores components 18 is placed on second tray placer 9B by causing tray supply head 11A to perform the tray transfer operation. The placement operation of the new tray 17 is performed before the component supply operation, in which tray 17 at component pick-up stage 4 is used as a target, is completed and tray 17 enters a vacant state.

Figures 8A, 8B:
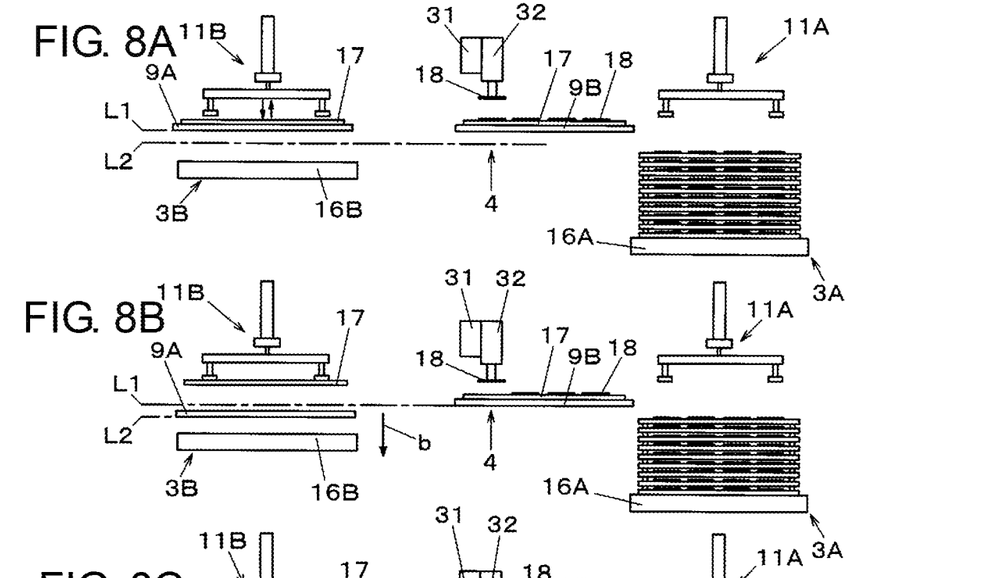
FIGS. 8A to 8D are operation explanation diagrams illustrating a tray supply method of the tray supplier of an embodiment of the present disclosure, and are diagrams illustrating the state of progression of operation, in order.

Subsequently, as illustrated in FIG. 8A, first tray placer 9A on which empty-state trays 17 are placed is moved from component pick-up stage 4 to collection-side tray storage unit 3B. Together with this movement, in supply-side tray storage unit 3A, second tray placer 9B which is positioned at first height level L1, that is, second tray placer 9B on which a new tray 17 in which components 18 are stored is placed, is moved to component pick-up stage 4. In component pick-up stage 4, the component supply operation which uses tray 17, which is placed on second tray placer 9B, as a target is started, and in collection-side tray storage unit 3B, empty tray 17, which is placed on first tray placer 9A, is picked up by tray collection head 11B. When moving second tray placer 9B, on which a new tray 17 in which components 18 are stored is placed, is moved to component pick-up stage 4, by causing second tray placer 9B to wait at a position in the vicinity of component pick-up stage 4, it is possible to shorten the time taken to perform exchanging from the empty-state tray 17 to the new tray 17.

Figures 8C, 8D:
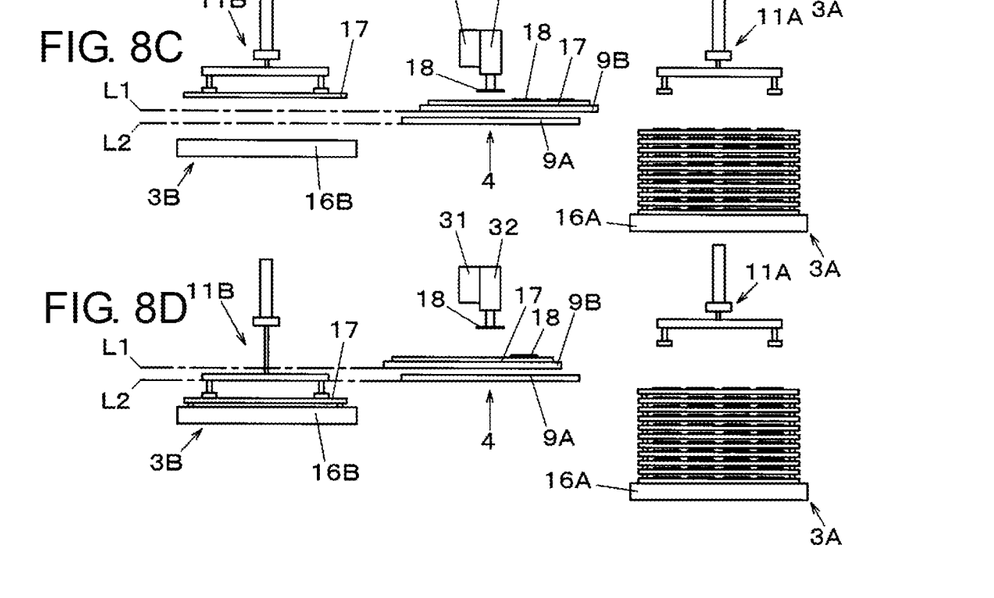

As illustrated in FIG. 8B, while the component supply operation is being executed at component pick-up stage 4, at collection-side tray storage unit 3B, first tray placer 9A is lowered from first height level L1 to second height level L2 (arrow b), and next, as illustrated in FIG. 8C, first tray placer 9A is moved to component pick-up stage 4 while still positioned at second height level L2. Next, as illustrated in FIG. 8D, at collection-side tray storage unit 3B, the empty tray 17 which is held by tray collection head 11B is lowered onto collection-side tray stacker 16B to cause collection-side tray stacker 16B to collect the empty tray 17. At this time, at component pick-up stage 4, the component supply operation is executed using tray 17 which is placed on second tray placer 9B as a target.

Figure 9A:
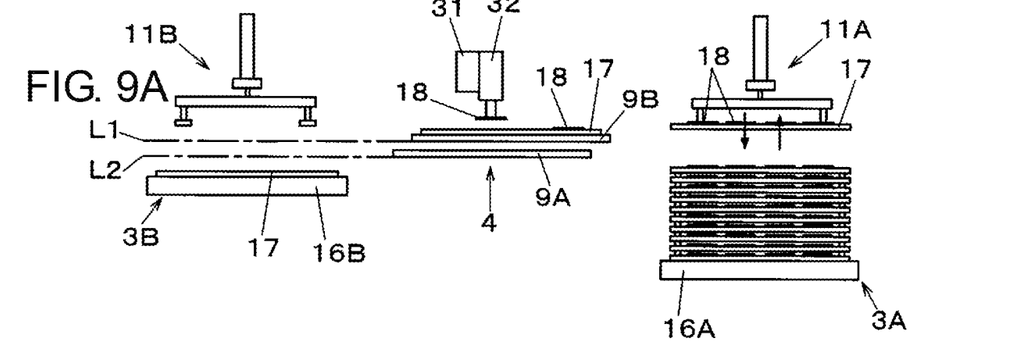
FIGS. 9A to 9C are operation explanation diagrams illustrating a tray supply method of the tray supplier of an embodiment of the present disclosure, and are diagrams illustrating the state of progression of operation, in order.
Figure 9B:
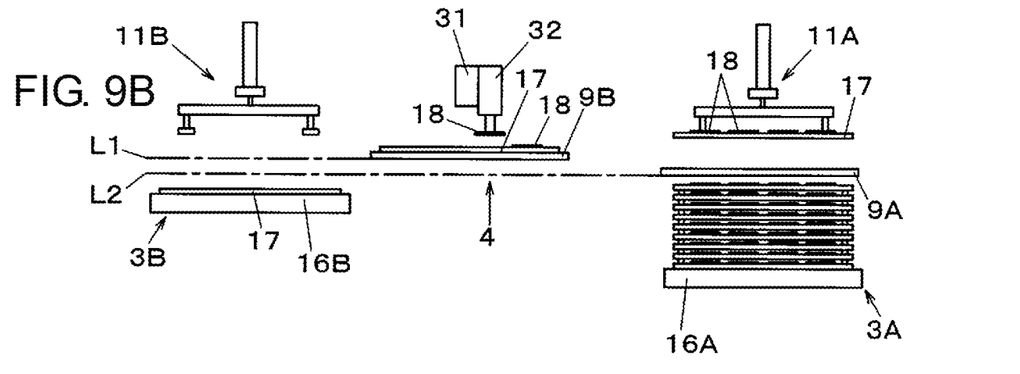
Figure 9C:
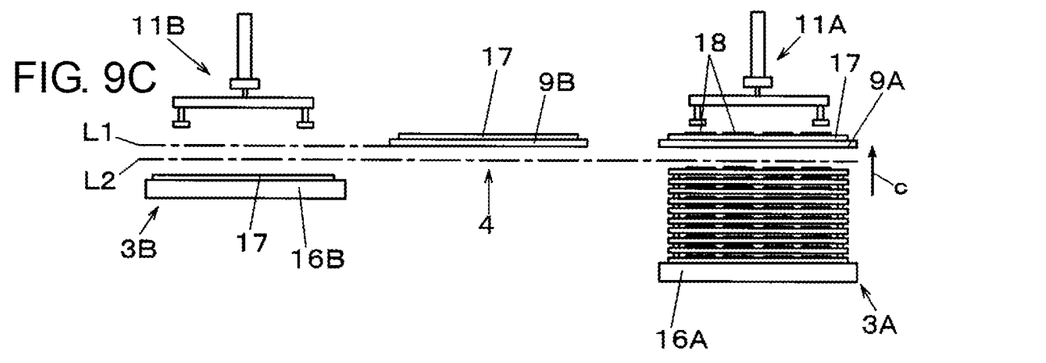

Next, as illustrated in FIG. 9A, at supply-side tray storage unit 3A, tray 17 which stores components 18 is picked up by tray supply head 11A. Next, as illustrated in FIG. 9B, first tray placer 9A which is positioned at second height level L2 is moved from component pick-up stage 4 to supply-side tray storage unit 3A, that is, to below tray 17 which is suction held by tray supply head 11A. As illustrated in FIG. 9C, first tray placer 9A is lifted from second height level L2 to first height level L1 (arrow c), and next, a new tray 17 which stores components 18 is placed on first tray placer 9A by causing tray supply head 11A to perform the tray transfer operation. The placement operation of the new tray 17 is performed before the component supply operation, in which tray 17 at component pick-up stage 4 is used as a target, is completed and tray 17 enters a vacant state.

As described above, in the tray supply method indicated in the present embodiment, when the supplying of components 18 is performed and one of first tray placer 9A and second tray placer 9B in which trays 17 are collected in collection-side tray storage unit 3B moves to supply-side tray storage unit 3A, the one of first tray placer 9A and second tray placer 9B is lifted or lowered by the lifting and lowering unit with which the first placer mover and the second placer mover are provided, and is moved in the direction of supply-side tray storage unit 3A so as not to interfere with the other of first tray placer 9A and second tray placer 9B for which the supply of components 18 is performed.

Accordingly, after first tray placer 9A or second tray placer 9B moves to supply-side tray storage unit 3A, a new tray 17 is placed thereon right away, and it is possible to assume a standby state. Therefore, after the component supply operation which uses tray 17 at a target is completed at component pick-up stage 4, it is possible to move first tray placer 9A or second tray placer 9B on which the next new tray 17 is placed right away from supply-side tray storage unit 3A to component pick-up stage 4 without requiring a waiting time, and it is possible to shorten the time necessary for exchanging trays 17 as much as possible to improve work efficiency.

The tray supplier and the tray supply method of the present disclosure have the effect of being capable of shortening the exchanging time of trays to improve work efficiency, and are applicable to the field of picking up components which are stored in a tray and mounted onto a board.

What is claimed is:

1. A tray supplier which performs supplying and collecting of trays in which components to be mounted onto a board are stored, the tray supplier comprising:
    a supply-side tray storage unit which stores the trays;
    a collection-side tray storage unit which collects the trays from which the supplying of the components has been performed;
    a first tray placer and a second tray placer on which the trays are placed;
    a first placer mover and a second placer mover which respectively move the first tray placer and the second tray placer between the supply-side tray storage unit and the collection-side tray storage unit; and
    a component pick-up stage which picks up the components from the trays transported from the supply-side tray storage unit and transports the trays from which the components are picked up to the collection-side tray storage unit, wherein the component pick-up stage is provided in a position between the supply-side tray storage unit and the collection-side tray storage unit,
    wherein a first movement shaft along which the first placer mover causes the first tray placer to move and a second movement shaft along which the second placer mover causes the second tray placer to move are disposed parallel to each other, and
    wherein the supply-side tray storage unit, a portion of the component pick-up stage and the collection-side tray storage unit are disposed in-line in this order between and along the first movement shaft and the second movement shaft,
    wherein the first tray placer and the second tray placer are vertically positioned at different heights, and horizontally movable between the supply-side tray storage unit and the collection-side tray storage unit through the component pick-up stage, and
    wherein the first tray placer and the second tray placer are at least partially overlapped with each other when the first tray placer and the second tray placer are located at the component pick-up stage.

2. The tray supplier of claim 1,
    wherein the first placer mover and the second placer mover each include a lifting and lowering unit for lifting or lowering the tray placed thereon, and
    wherein after passing the tray to the collection-side tray storage unit, one of the first placer mover and the second placer mover lifts or lowers one of the first tray placer and the second tray placer and moves the one of the first tray placer and the second tray placer in a direction of the supply-side tray storage unit so as not to interfere with the other of the first placer mover and the second placer mover.

3. The tray supplier of claim 1,
    the component pick-up stage includes a retaining member which retained from the end of the tray of the top surface side.

4. A tray supply method of passing trays from a supply-side tray storage unit, which stores the trays in which components to be mounted onto a board are stored, to a first tray placer and a second tray placer, picking up the components from the trays transported from the supply-side tray storage unit, transporting the trays from which the components are picked up to a collection-side tray storage unit, and moving the first tray placer or the second tray placer on which the tray from which component supplying has been performed is placed to cause the collection-side tray storage unit to collect the tray,
    wherein when the supplying of the components is performed and one of the first tray placer and the second tray placer, which has been previously collected in a collection-side tray storage unit, moves to the supply-side tray storage unit, the one of the first tray placer and the second tray placer is lifted or lowered and is moved in the direction of the supply-side tray storage unit so as not to interfere with the other of the first tray placer and second tray placer for which the supply of components is performed,
    wherein a first movement shaft along which the first placer mover causes the first tray placer to move and a second movement shaft along which the second placer mover causes the second tray placer to move are disposed parallel to each other, and
    wherein the supply-side tray storage unit, a portion of the component pick-up stage and the collection-side tray storage unit are disposed in-line in this order between and along the first movement shaft and the second movement shaft,
    wherein the first tray placer and the second tray placer are vertically positioned at different heights, and horizontally movable between the supply-side tray storage unit and the collection-side tray storage unit through the component pick-up stage, and
    wherein the first tray placer and the second tray placer are at least partially overlapped with each other when the first tray placer and the second tray placer are located at the component pick-up stage.

5. The tray supply method of claim 4,
the component pick-up stage includes a retaining member which retained from the end of the tray of the top surface side,
wherein the end of tray is retained from the top surface side by the retaining member.

* * * * *